US009470733B2

United States Patent
Baglio et al.

(10) Patent No.: US 9,470,733 B2
(45) Date of Patent: Oct. 18, 2016

(54) SENSOR INCORPORATING MULTIFERROIC MATERIALS FOR DETECTING BOTH ELECTRIC AND MAGNETIC FIELDS

(71) Applicants: Salvatore Baglio, San Giovanni la Punta (IT); Bruno Ando, Aci Catena (IT); Adi Ratan Bulsara, San Diego, CA (US); Angela Beninato, Leonforte (IT); Teresa Emery, San Diego, CA (US)

(72) Inventors: Salvatore Baglio, San Giovanni la Punta (IT); Bruno Ando, Aci Catena (IT); Adi Ratan Bulsara, San Diego, CA (US); Angela Beninato, Leonforte (IT); Teresa Emery, San Diego, CA (US)

(73) Assignee: The United States of America, as Represented by the Secretary of the Navy, Washington, DC (US)

( * ) Notice: Subject to any disclaimer, the term of this patent is extended or adjusted under 35 U.S.C. 154(b) by 86 days.

(21) Appl. No.: 14/543,409

(22) Filed: Nov. 17, 2014

(65) Prior Publication Data

US 2016/0139190 A1 May 19, 2016

(51) Int. Cl.
*G01R 29/12* (2006.01)
*G01R 33/02* (2006.01)
*G01R 33/06* (2006.01)

(52) U.S. Cl.
CPC ............... *G01R 29/12* (2013.01); *G01R 33/02* (2013.01); *G01R 33/06* (2013.01)

(58) Field of Classification Search
CPC ............ G01R 33/02; G02B 6/00; H01P 3/12
See application file for complete search history.

(56) References Cited

U.S. PATENT DOCUMENTS

| | | | | |
|---|---|---|---|---|
| 5,487,030 A * | 1/1996 | Drab | ........................ | G11C 11/22 365/145 |
| 5,966,318 A * | 10/1999 | Ramer | ...................... | G11C 11/22 365/145 |
| 6,028,783 A * | 2/2000 | Allen | ........................ | G11C 11/22 365/145 |
| 6,149,774 A * | 11/2000 | Sun | ........................ | B01J 19/0046 118/624 |
| 6,327,558 B1 * | 12/2001 | Nishimura | .......... | G06F 17/5036 703/2 |
| 7,345,475 B2 * | 3/2008 | Takeuchi | ............... | G01R 33/18 324/244 |
| 7,420,366 B1 | 9/2008 | In et al. | | |
| 7,528,606 B1 | 5/2009 | In et al. | | |

(Continued)

OTHER PUBLICATIONS

K. K Prashanthi, S.P. Duttagupta, R. Pinto and V.R. Palkar (Multiferroic Bi0.7Dy0.3FeO3 films as high k dielectric material for advanced non-volatile memory devices) Electronics Letters Jul. 30, 2009 vol. 45 No. 16.*

(Continued)

*Primary Examiner* — Vinh Nguyen
*Assistant Examiner* — Alvaro Fortich
(74) *Attorney, Agent, or Firm* — SSC Pacific Patent Office; Arthur K. Samora; Kyle Eppele

(57) ABSTRACT

A sensor for detecting both magnetic fields and electric fields can include at least one Sawyer-Tower (ST) circuit that can incorporate a multiferroic capacitor. An odd number of ST circuits coupled together in a ring configuration, so that for each ST circuit, the output of one ST circuit is an input to another of the ST circuits. The multiferroic capacitors can include a multiferroic layer that can be deposed on a substrate. For each multiferroic capacitor, the deposition process can cause an inherent amount of impurities in the multiferroic layer. The number of said odd number of ST circuits to be coupled together is chosen according to the amount of impurities, to "forgive" the impurities. The higher the level of impurities in the multiferroic layers, that more ST circuits that are required in the ring to achieve the same sensor sensitivity. BDFO can be chosen for the multiferroic material.

8 Claims, 7 Drawing Sheets

(56) References Cited

U.S. PATENT DOCUMENTS

| | | | |
|---|---|---|---|
| 7,898,250 B2 | 3/2011 | In et al. | |
| 8,049,586 B2 | 11/2011 | In et al. | |
| 8,803,264 B1* | 8/2014 | Katiyar | H01L 29/516 257/421 |
| 2004/0016889 A1* | 1/2004 | Schubring | G01J 5/34 250/458.1 |
| 2004/0178841 A1* | 9/2004 | Mantese | H01L 41/1132 327/509 |
| 2011/0008008 A1* | 1/2011 | Chowdhury | G02F 1/0009 385/122 |
| 2011/0187553 A1* | 8/2011 | Rodney | E21B 47/122 340/852 |
| 2012/0098589 A1* | 4/2012 | Spanier | B82Y 10/00 327/530 |
| 2014/0159713 A1* | 6/2014 | Nersessian | G01R 33/0385 324/244 |

OTHER PUBLICATIONS

A. Beninato et al., A Concept for a Magnetic Field Detector Underpinned by the Nonlinear Dynamics of Coupled Multiferroic Devices, Applied Physics Letters 103, 244107, pp. 244107-1 to 244107-4, Dec. 13, 2013, online.

V.R. Palkar et al., Observation of Magnetoelectric Coupling in Bi0.7Dy0.3FeO3 (BDFO) Thin Films at Room Temperature, Applied Physics Letters 93, 132906, pp. 132906-1 to 132906-3, (2008), online.

V.C. Lo, Simulation of Thickness Effect in Thin Ferroelectric Films Using Landau-Khalatnikov Theory, Journal of Applied Physics, vol. 94, No. 5, pp. 3353-3359, Sep. 1, 2003, online.

J.T. Evans, Jr., Operating the Radiant TO-18 Sawyer-Tower Board, Radiant Technologies, Inc. PowerPoint(R) Presentation, Apr. 5, 2013, http://www.ferromems.com/1/360/files/Sawyer-TowerBoard-Description.pdf.

B. Ando et al., A Coupled Nonlinear Circuit for E-Field and B-Field Detection, Sensors Applications Symposium (SAS), 2014 IEEE, vol., No., pp. 223-227 (ISBN 978-1-4799-2180-5), Feb. 18-20, 2014, Queenstown, New Zealand.

Carlo Trigona et al., Exploiting Nonlinear Dynamics in Novel Measurement Strategies and Devices: From Theory to Experiments and Applications, IEEE Transactions on Instrumentation and Measurement, (IEEE), 2011 60 (3), pp. 667-695.

* cited by examiner

SENSOR INCORPORATING MULTIFERROIC MATERIALS FOR DETECTING BOTH ELECTRIC AND MAGNETIC FIELDS

FEDERALLY-SPONSORED RESEARCH AND DEVELOPMENT

The United States Government has ownership rights in this invention. Licensing inquiries may be directed to Office of Research and Technical Applications, Space and Naval Warfare Systems Center, Pacific, Code 72120, San Diego, Calif., 92152; telephone (619)553-5118; email: ssc_pac_t2@navy.mil, referencing NC 102801.

FIELD OF THE INVENTION

The present invention pertains generally to sensors. More particularly, the present invention pertains to sensors for detecting both electric fields and magnetic fields. The present invention can be particularly, but not exclusively, useful as a sensor that can incorporate multiferroic materials in order to quantify magnetization as well as electric field by exploiting the nonlinear electrical behavior of the multiferroic element, using an applied electric field, instead of an applied (driving) electric current.

BACKGROUND OF THE INVENTION

Magnetometers, or sensors for detecting magnetic fields, are well known in the prior art. Such prior art magnetometers can consist of a small, magnetically susceptible core wound by two coils of wire. An alternating electrical current can be passed through one coil, which can induce an electrical current in the second coil, and this output current, mediated by the magnetically susceptible core, can be measured by a detector. In a magnetically neutral background, the input and output currents will match. However, when the core is exposed to a background field, it can be more easily saturated in alignment with that field and less easily saturated in opposition to it. Hence the alternating magnetic field, and the induced output current, will be out of phase with the input current. The extent to which this is the case will depend on the strength of the background magnetic field. Often, the current in the output coil can be integrated to yield an output analog voltage, which can be proportional to the magnetic field. But for these types of sensors, an applied current is required.

Multiferroics, or materials that simultaneously exhibit magnetic and ferroelectric orders, are also known in the prior art. These materials can often also be termed as magnetoelectrics, because the material magnetic and electric order parameters are coupled. Multiferroics can be technologically important, as they can have two or more switchable states, like a magnetization state that may be switched with an electric field, and a spontaneous electric polarization state that may be switched with a magnetic field. Such materials can play a vital role in the design of electric-field controlled ferromagnetic resonance devices, actuators, and variable transducers with magnetically-modulated piezoelectricity etc. Additionally, magnetoelectrics can also have tremendous potential for use in storage devices where writing and read-out can be carried out by both/either of electric or magnetic fields. In sum multiferroics can be important to any device where it is preferable to use an electric field, instead of electric current, to operate the device.

Interestingly, recent experimental and theoretical studies explicitly reveal novel behavior and exciting physics in multiferroic materials. Being of great interest, and being motivated by on-chip integration in microelectronic devices, nanostructured composites of ferroelectric and magnetic oxides deposition as a thin film on a substrate are being increasingly studied. Such initiatives are expected to lead to a better understanding of the basic nature of magneto-electric coupling so that the magneto-electric coupling can be used for specialized applications.

Research on the optimization of the performance of magnetometers that use ferromagnetic cores, and on non-linear oscillators for electric field sensing based on ferro-electric capacitors continues to be ongoing in the prior art. However, up until now, minimization of the power demand for magnetometers (which is a key optimization feature) has been limited due to the intrinsic properties of the device, which must be "current driven" in order to ensure a proper magnetization of the core. Because the prior art magnetometers need an applied current to operate, the power budget for the prior art device cannot be reduced below a certain threshold, which can further place limits on both the size and the sensitivity of the device.

The availability of materials whose magnetization can be quantified not via an applied current but by using an electric field would represent a major breakthrough in the field given the inherent low power ("nearly zero power") of this approach. This is the promise given by multiferroic materials that are therefore hysteretic in both the electric and the magnetic domain. An adequate knowledge of these materials and a suitable exploitation of their unique features could therefore lead to novel devices that can detect weak low frequency magnetic fields and that demand a negligible amount of power to operate.

In view of the above, it is an object of the present invention to provide a sensor that can incorporate multiferroic materials to detect electric fields or magnetic fields using the same underlying setup. Another object of the present invention is to provide a sensor that can incorporate multiferroic materials to measure magnetic fields using an applied electric field instead of an applied electric current. Still another object of the present invention is to provide a sensor that can incorporate multiferroic materials that have an extremely low power footprint to accomplish the measurement of electric fields and magnetic fields. Another object of the present invention to provide a sensor that can incorporate multiferroic materials, which can be easy to manufacture, and which can be used in a cost-efficient manner. Finally, the unique coupling configuration affords enhanced target signal resolution; in fact the resolution can be shown to improve with N the number of coupled circuit block.

SUMMARY OF THE INVENTION

A sensor for detecting magnetic fields and electric fields, and methods for detecting such fields, can include at least one Sawyer-Tower (ST) circuit that can incorporate a multiferroic capacitor. An odd number of ST circuits can be coupled together in a ring configuration, so that for each ST circuit, the output of one ST circuit can be an input to another of the ST circuits. The multiferroic capacitors can further include a multiferroic layer that can be deposed on a substrate. For the multiferroic capacitors, the deposition process can cause an inherent amount of impurities in the crystal structure of the multiferroic layer. These imperfections can lead to slight differences in the BDFO properties, which can be an undesirable result. However, the number of ST circuits to be coupled together can be chosen according to amount of impurities that can be caused by the deposition process, to "forgive" the impurities. The higher the level in impurities in the multiferroic layers, that more ST circuits are required in the ring to achieve the same ST circuit gain (sensor sensitivity) that is desired by the user.

The above structure and cooperation of structure can allow for a sensor that can detect magnetic fields using an applied electric field, instead of an electric current. One material that can be chosen for the multiferroic layer can be BDFO (a bulk material). Other materials that exhibit multiferroic properties could also be used. The multiferroic capacitor can further include a bias part and a sensing part. The sensing part can include a charge collector for sensing electric layer (e.g. PZT) and a magnetostrictive layer, e,g, Terfenol-D.

BRIEF DESCRIPTION OF THE DRAWINGS

The novel features of the present invention will be best understood from the accompanying drawings, taken in conjunction with the accompanying description, in which similarly-referenced characters refer to similarly-referenced parts, and in which.

DETAILED DESCRIPTION OF THE EMBODIMENTS

I. Introduction

Figure 1:
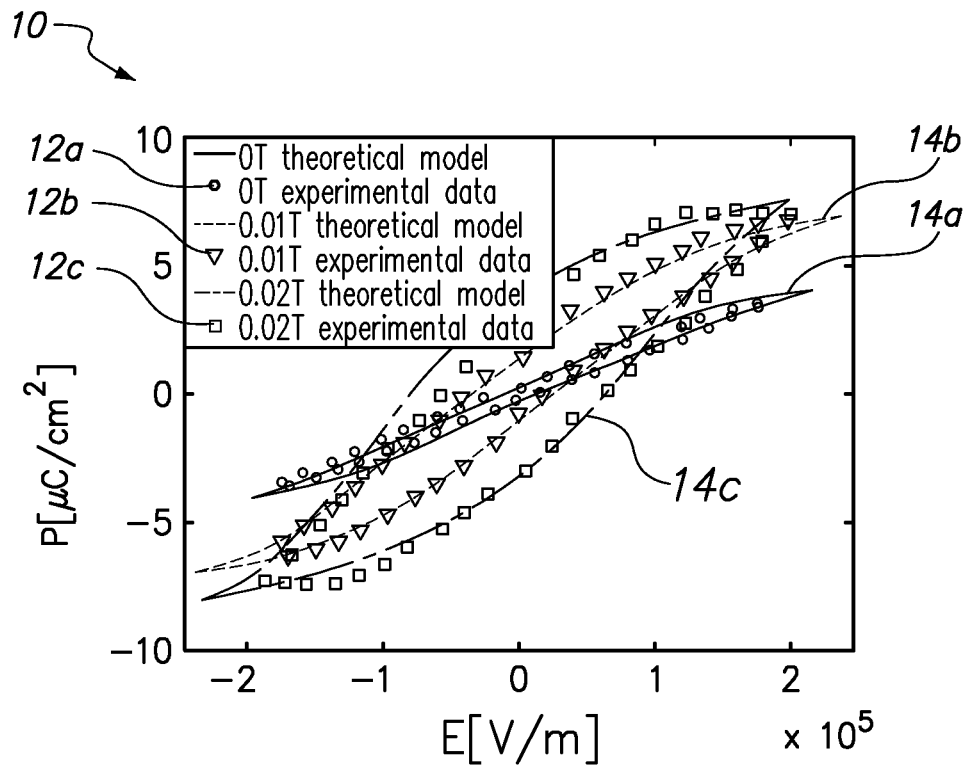
FIG. 1 is a graph of a theoretical modeling of the hysteresis loop of a representative multiferroic layer for the device of the present invention according to several embodiments.

In the prior art, a large class of materials can exhibit the ferroic orders of ferroelectricity, ferromagnetism or ferroelasticity. Materials in which at least two of the three ferroic orders exist can be called multiferroic (MF) materials. Of particular interest are magnetoelectric multiferroics, in which the ferroelectric and ferromagnetic orders not only coexist in the same material, but are also coupled to each other such that an E-field can induce a magnetization and a B-field can induce a polarization. The term magneto-electric effect, then, can be used to describe any form of cross-correlation between magnetic and dielectric properties.

Of the materials that exhibit magnetoelectricity, the perovskite phase of $BiFeO_3$ (BFO) can be unique. This is because BFO is an antiferromagnetic material, but the addition of Dy to the BFO can change the ordering from antiferromagnetic to ferromagnetic, and can result in a multiferroic material that can often exhibit magnetoelectric coupling at room temperature. In the recent prior art, a large spontaneous electric polarization (60 $\mu Ccm^{-2}$) in combination with a substantial thickness-dependent saturation magnetization (150 $emucm^{-3}$), was observed above room temperature in thin films of BFO grown epitaxially on $SrTiO_3$ substrates.

To enhance the magnetoelectric coupling of BFO, several doping methods and materials can be used to modify $BiFeO_3$ by chemical substitutions at the Bi or Fe sites. In particular, Palkar and Prashanthi showed that a substitution of Dy at the Bi site in $BiFeO_3$ (BDFO) can induce ferromagnetism in $BiFeO_3$ without disturbing the ferroelectric behavior. The effect of an applied direct current (DC) B-field on the electric polarization was demonstrated through its effect on the ferroelectric hysteresis loop: both the slope and the saturation polarization increased with the B-field value; the converse effect was also demonstrated. At the same time, the inventors of the present invention according to several embodiments conceived of the idea of exploiting hysteretic behaviors of the multiferroic materials by using the multiferroic materials as ferroelectric capacitors for E-field sensing. To do this, a nonlinear ring oscillator underpinned by ferroelectric capacitors has been developed and characterized for its ability to measure weak electric fields.

II. Magnetic (B) Field Detection

The present invention according to several embodiments can focus on the change of the ferroelectric hysteresis with an applied B-field. The present invention can show that the magneto-electric effect of BDFO (BDFO is described as an example, but other multiferroic materials could be used) can be opportunistically exploited to detect and quantify an external B-field through the change that it produces in the electrical order. A theoretical phenomenological model of hysteretic behavior which can be based on the empirical data of BDFO material can be developed. The model can be used to quantify the response, to a B-field, of a single BDFO-based capacitive sensor. A single BDFO sensor, then, can underpins a more complex sensor comprising an odd number (N=3 elements can be used) of electrically (and unidirectional) coupled Sawyer-Tower (ST) circuits, underpinned by BDFO capacitors. The ring configuration can afford enhanced sensitivity (compared to a single ST circuit) to small changes in the ambient B-field (For purposes of this disclosure, an ST circuit can be defined as a circuit that can convert polarization to a voltage in order to quantify (measure) polarization).

For the present invention, and referring initially to FIG. 1, thin film BDFO devices can be subject to different values of DC B-fields (as perturbations to the ambient DC B-field) and the polarization (P) versus E-field (E) hysteresis loops can be obtained for each case. Graph 10 in FIG. 1 illustrates prior art empirical data 12a for B=0 T, data 12b for B=0.01 T and data 12c for B=0.02 T. As shown in FIG. 1, good magnetoelectric coupling can be observed, i.e., the (ferroelectric) hysteresis loops characteristics change with the applied B-fields.

From the above, it can be seen that a "blueprint" can be developed for a detector that can exploit the dynamics of coupled nonlinear systems. The blueprint procedure can include the steps of: (1) Determining macroscopic dynamical equation for the ferroelectric component of the BDFO film, (2) Obtaining the material parameters in the (bistable) potential energy function by numerical fits to the experimental data; (3) Implementing a precisely crafted coupling of an odd (N>1) number of devices using the obtained material parameters, a procedure that can be shown to yield enhanced sensitivity (over the N=1 case) to small B-field changes; and, (4) Simulating the device using a PSPICE circuit model.

To determine the model the polarization dynamics, standard Landau-Khalatnikov theory as known in the prior art could be used:

$$\tau \frac{dP}{dt} = -\frac{\partial U}{\partial P}; \ U(P,t) = -\frac{a}{2}P^2 + \frac{b}{4}P^4 - cE(t-\phi)P \quad (1)$$

Equation (1) can correspond to the particle-in-potential paradigm with U(P,t) being the (bistable) potential energy function, and the materials-based parameters (a, b) must be positive to ensure bistability. The parameters (a,b,c) can be phenomenological coefficients calculated via a fitting algorithm to ensure the good agreement between the experimentally obtained hysteresis and its theoretically model. "c" can be a materials-based parameter that quantifies the effect of the external electric field on the multiferroic polarization. "τ" can represent the device time-constant, and "φ" can be a phase-lag between the input and output (introduced by the prior art test equipment). In the absence of the driving term (i.e., E=0 which can cause "c" to be 0), the width of the hysteresis loop (between its intersections of 0) the stable minima of the potential function can occur at $\pm r_i = \pm\sqrt{b/a}$, and the energy barrier height can be $U_0 = a^2/4b$. The connection to the hysteresis loop is made by noting that coercivity $E_c = \pm\sqrt{4a^2 r_i^2/27}$, while the width of the hysteresis loop (between its intersections of the E axis) can be proportional to $U_0/2r$. Thus, a simplex parameter identification procedure can be used to obtain a theoretical representation of the dynamics that underpin the experimentally obtained hysteresis loops by Palkar et al. in the prior art. The theoretical representations can be illustrated as hysteresis loops 14a, 14b and 14c in FIG. 1. Fig. shows the experimentally obtained hysteresis loops together with the numerical fit using Equation (1). The numerical fitting yielded $\phi \approx \pi/2$ for all three cases.

From the above, it can be seen that the application of the Landau-Khalatnikov theory can yield the coefficients (a, b, c, τ) for the 3 values of the applied B-field (B=0 T, B=0.01 T and B=0.02 T). These parameters, listed in Table 1, change monotonically with the applied B-field and could be used to extend the model to extrapolate the effects of B-fields not specifically applied in the prior art.

TABLE 1

| Magnetic Field | 0T | 0.01T | 0.02T |
| --- | --- | --- | --- |
| a | 8.967 × 10⁻⁷ | 1.029 × 10⁻² | 1.133 × 10⁻² |
| b | 3.936 × 10⁻⁴ | 1.421 × 10⁻⁴ | 1.260 × 10⁻⁴ |
| c | -2.250 × 10⁻⁷ | -2.395 × 10⁻⁷ | -2.459 × 10⁻⁷ |
| τ | 1.259 × 10⁻² | 1.013 × 10⁻² | 8.507 × 10⁻³ |

Figure 2:
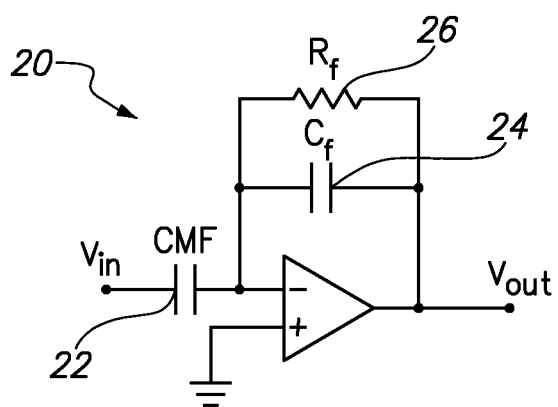
FIG. 2 is circuit diagram of the sensor of the present invention.

To implement the above model, polarization can be measured through a charge-to-voltage conversion obtained by using an above-defined ST circuit. Such a circuit 20 can be illustrated in FIG. 2. As shown in FIG. 2, ST circuit 20 can include a multiferroic capacitor 22, represented by $C_{MF}$. A MF capacitor can be a capacitor that includes a multiferroic layer. A multiferroic layer is a layer can be a material that is multiferroic, such as BDFO. Other multiferroic layers could be used, provided such materials exhibit the hysteresis behavior described above. In circuit 20, multiferroic capacitor 22 can function as the active nonlinear element, $C_f$ can represent the feedback capacitor 24 used to fix the working point of the circuit 20 and the resistor 26 $R_f$ can be introduced to avoid drift in the circuit output. The frequency response of the ST circuit 20 can be given by $$\frac{V_{out}(s)}{V_{in}(s)} = -\frac{C_{MF}}{C_F} \frac{sC_f}{1+sC_f}\left(\frac{R_f}{R_f}\right) \quad (2)$$

Choosing $R_f \gg (sC_f)^{-1}$, it can be shown that $$V_{out} = -\frac{A_{MF}}{C_f}P, \quad (3)$$

where $A_{MF}$ can be the surface area of the electrode (the multiferroic layer) of the MF capacitor.

Figure 3:
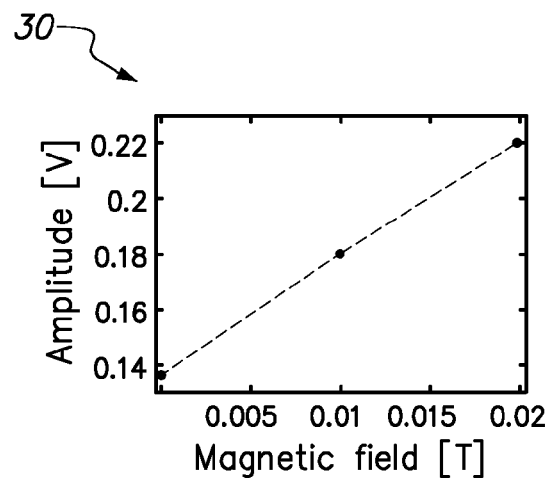
FIG. 3 is a graph of voltage versus magnetic field amplitude, which can be used to estimate the sensitivity of the sensor of FIG. 2.

With a sinusoidal voltage (amplitude 100 mV and frequency 10 Hz) applied at $V_{in}$, the changes in the output voltage amplitude, for different values of the external B-field (B=0 T, B=0.01 T and B=0.02 T), can be shown in graph 30 in FIG. 3. The results displayed in graph 30 can illustrate a sensitivity of 4.2V/T for circuit 20 over the range considered (0≤B≤0.02 T). Sensitivity can improve to 4.5V/T, corresponding to a change of 33% in the output voltage amplitude for a change of 0.01 T in the external B-field, when smaller (around zero) changes of the target B-field are considered.

Figure 4:
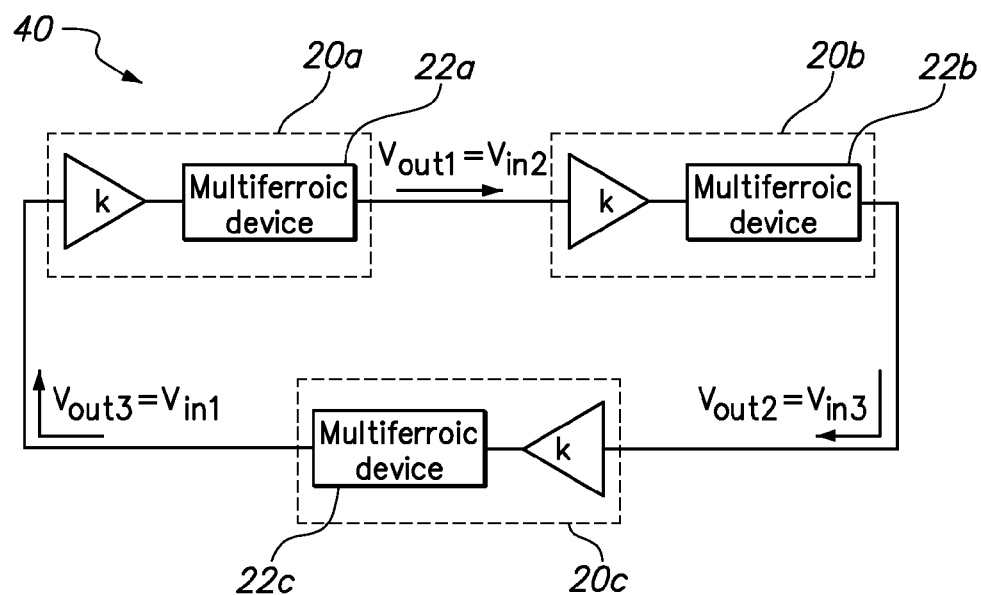
FIG. 4 is a block diagram of a plurality of the sensors of FIG. 2, when in a ring configuration.

The implementation of a single ST circuit 20 shown in FIG. 2 with the BDFO capacitor 22 can underpin a coupling scheme wherein N circuit "blocks" of circuit 20 can be coupled. Referring now to FIG. 4 (In FIG. 4, N=3), in a ring configuration 40 of ST circuits 20 having cyclic boundary conditions can be shown. As used herein, the term "ring" or "ring configuration" shall mean that for each ST circuit 20 in ring configuration 40 the output of one ST circuit 20 in ring configuration 40 shall be the input of another ST circuit 20. In FIG. 4, one can start with the dynamics of a single capacitor, for example multiferroic capacitor 22a in this coupled ring 40, we readily see that the voltage in one element $V_{in1}$ is connected, linearly, to the output voltage of the preceding element via the gain coefficient k, i.e. $V_{in1} = kV_{out3}$. Repeating this for each capacitor 22a, 22b, 22c of FIG. 4, the dynamics of the coupled ring 4 can be expressed as:

$$\tau \dot{P}_i = aP_i = bP_i^3 + \lambda P_{i-1}; i=1 \ldots 3. \quad (4)$$

where, taking Equations (1) and (3) into account, the coupling strength can be expressed in terms of a (negative) gain k as $$\lambda = c\frac{A_{MF}}{dC_f}k.$$

λ can therefore be a tunable parameter, where varying the c, $A_{MF}$, ("d" is the thickness of the multiferroic layer) or $C_f$ parameters can vary λ.

It should be noted that as λ can change due to the change in the multiferroic material c parameter, which can further change as a consequence of the external magnetic field. This can be the case even if k is held constant. Equation (4) can be simulated using Simulink (other types of software known in the art for this purpose) by using the material a, b, c and τ parameters from Table 1 from the measurements taken on the MF samples. The Simulink results, therefore, can be highly representative of the real system behavior. The system coefficients can be $A_{MF}$=100×100 μm² (i.e., the area of the multiferroic layer 22 when viewed in top plan), $C_f$=10 nF, and d=250 nm, in order to be close to a realistic set of values for the multiferroic capacitor 22. The application of an external target B-field corresponds to a change in the material parameters in accordance with the listings in Table 1.

Figure 5:
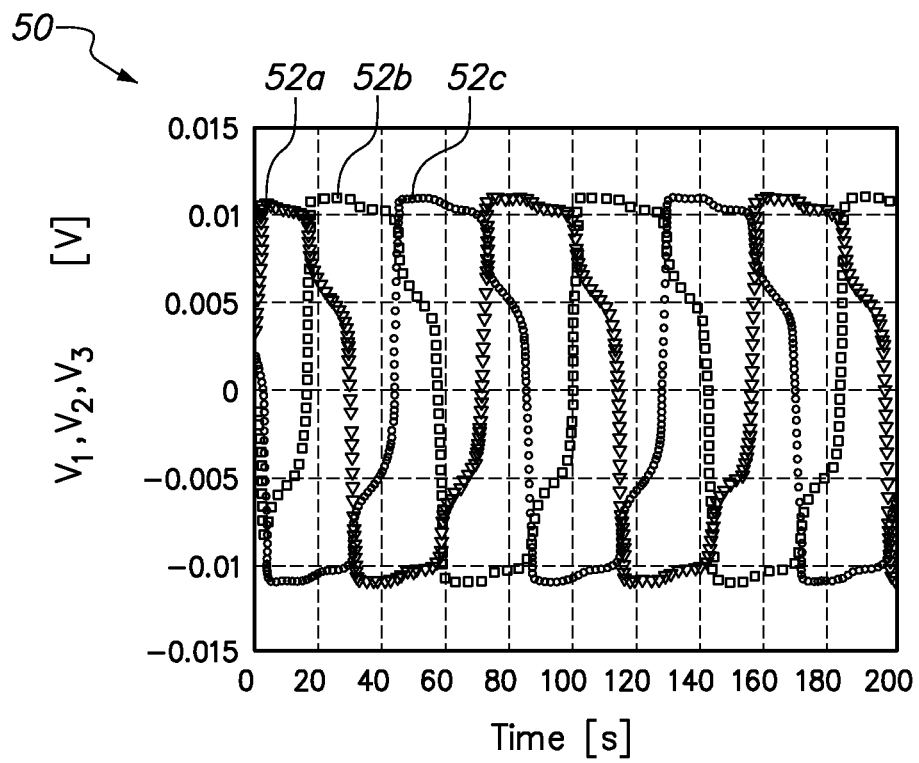
FIG. 5 is a graph of the voltage response of the ring configuration of FIG. 4 for k=4.
Figure 6:
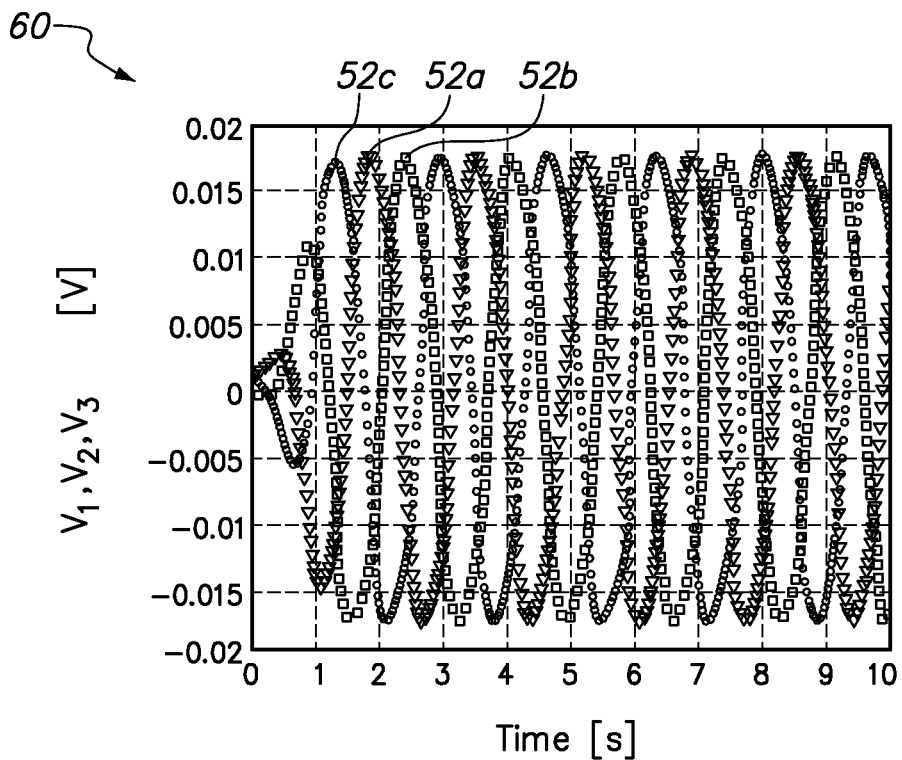
FIG. 6 is the same graph as FIG. 5, but with k=40.

Referring now to FIGS. 5 and 6, simulated voltage responses can be shown by graphs 50 and 60, respectively. Graph 50 in FIG. 5 is a simulation curves 52a, 52b, and 52c of the voltage response for each circuit 20a, 20b 20c in ring 40 in FIG. 4 for B=0.02 T, for k=4.0, which further corresponds to λ≈$λ_c$ ($λ_c$ can correspond to the λ at which oscillatory behavior begins to occur). Graph 60 in FIG. 6 can illustrate simulation curves 62a, 62b and 62c for the same circuits 20 in ring 40, but for k=40, which can correspond to λ>>$λ_c$. By cross-referencing FIGS. 5 and 6, it can be inferred that past a critical value $λ_c$=a/2 of the control parameter λ, the solutions of Equations (4) can be oscillatory (although not sinusoidal, see FIG. 5) unless λ>>λ. But when λ>>$λ_c$, and as shown in FIG. 6, the solutions of Equation (4) can be both oscillatory and sinusoidal, with amplitude and period dependent on the parameters (a, b, λ). Thus, the oscillation characteristics might be useful to quantify the external magnetic field B, via the changes in their characteristics induced by changing the parameters listed in Table 1.

It should be noted that the "oscillations" in FIGS. 5 and 6 can actually be switching events between the stable attractors of each element in Equation (4); this switching can be driven by the coupling term λ since, for λ≤$λ_c$, the system is overdamped and no switching occurs. The oscillatory behavior also occurs only for odd N (N≥3). A system of the form in Equation (4) has been previously disclosed in U.S. Pat. No. 7,420,366, by Visarath In et al., for an invention entitled Coupled Nonlinear Sensor System. In et al. disclosed that the sequential (due to the unidirectional coupling) nature of the switching between stable attractors of each element $P_i$ can allow for an analytic computation of the oscillation frequency.

From FIGS. 5 and 6, it can be seen that the amplitude of oscillations 52 can correspond roughly to one-half the separation of the saturation states. The oscillation period $T_i$ for each element $P_i$ can be obtained as $$T_i = N\sqrt{2}\pi[|f(P_{10})f''(P_{10})|^{-1/2} + |f(-P_{10})f''(-P_{10})|^{-1/2}], \quad (5)$$

where $f(P_1)$ can be defined as $aP_1 - bP_1^3 - λP_{2m}$ (see Equation 4), $P_{2m} = \sqrt{(a+λ)/b}$, $P_{10} = \sqrt{a/3b}$ and the primes denote differentiation with respect to $P_1$. The oscillations in the 3 elements $P_i$ are separated in phase by 2π/N, and the period T can be shown to scale according to the relationship $1/\sqrt{|λ-λc|}$ which can be characteristic of this class of bifurcation. The amplitude and frequency of the oscillations generated for three cases of applied DC B-field, where the case were obtained through numerical simulation of the coupled system with BDFO capacitors from Table 1 (a, b, c and τ) can be described in Table 2 below. For each value (0 T, 0.01 T, 0.02 T) of the "target" B-field in Table 2, the parameters in the system of Equation (4) can be changed in accordance with Table 1, with k=40. Table 2 can also show the values of λ corresponding to each value of the B-field.

TABLE 2

| Magnetic Field B (T) | Coupling Factor λ (k = 40) | Frequency (Hz) | Amplitude ($mV_{pp}$) |
|---|---|---|---|
| 0 | 0.036 | 0.4 | 9 |
| 0.01 | 0.038 | 0.5 | 16 |
| 0.02 | 0.039 | 0.6 | 18 |

From the above, it can be seen that the change in B-field can be quantified through the change in the oscillation frequency and especially through the change in amplitude of curves 52. In fact, the sensitivity of the output frequency and amplitude, respectively, with regard to an applied change in external B-field can be estimated as $$S_B^f = \frac{\Delta f}{\Delta B}, \quad S_B^A = \frac{\Delta A}{\Delta B} \quad (6)$$

Using the data above, and referring to the changes in the B-field around zero, a sensitivity of 7V/T with respect to output voltage can be obtained, which can correspond to a change in the output voltage of 77% for a change of 0.01 T in the B-field. This can confirm that the change in the oscillation amplitude might be the better indicator of a change in the applied magnetic signal (field). Referring briefly back to FIG. 3, and recalling that the sensitivity for a single sensor was in the 4.2V/T to 4.5V/T range, it can be inferred that the sensitivity obtained for the coupled system can be almost twice that provided by the single element. Moreover, the output amplitude and frequency can increase with the coupling gain k; therefore k can be a tunable parameter to make the system work in a desired range of frequency or amplitude.

It should be reiterated that from the above, a "blueprint" for a small and cheap B-field sensor that exploits microscale and/or nanoscale materials (in this case the multiferroic BDFO) and recent ideas in the physics of coupled nonlinear systems. Using experimental (time-series) data that leads to the hysteresis behavior shown in the prior art, suitable system parameters (Table 1) can be identified by suitable fitting techniques. Once the system parameters have been determined, these parameters can be used (FIG. 5 and Table 2) to establish a multiferroic capacitor 22, which can be incorporated into a ST circuit to quantify (measure) a magnetic field without requiring the use of a driving current. Moreover, coupling the ST circuits in a ring 40 can yield better sensitivity over the single element configuration.

III. Electric (E) Field Detection

Figure 7:
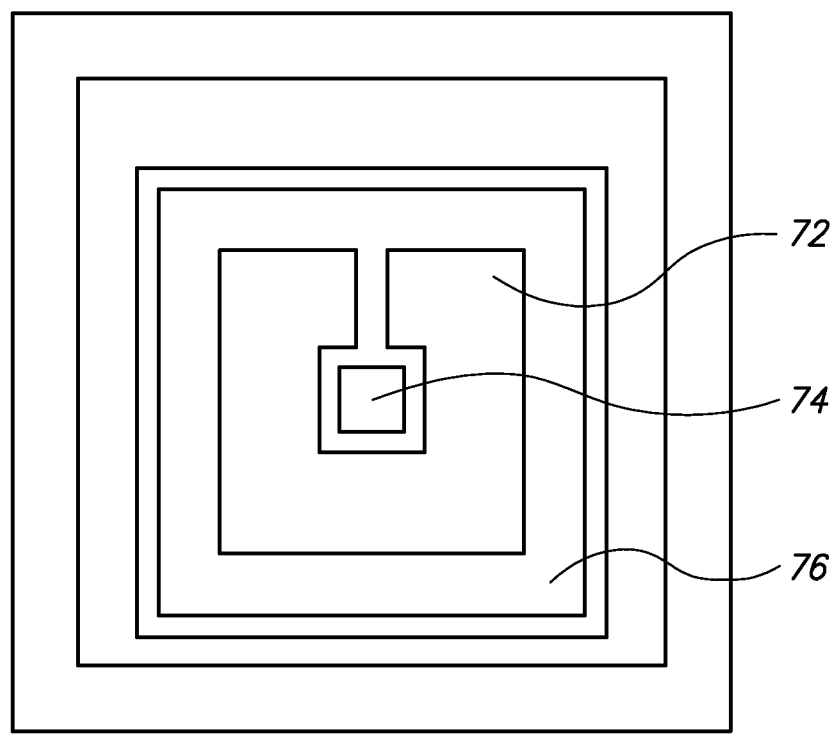
FIG. 7 is a top plan view of the sensor of FIG. 2, but when configured to simultaneously measure electrical field and magnetic fields.

Based on previous work by the inventors, it can be seen that a proper arrangement of the device electrodes can allow one to obtain responses both for an external electric field and for the external magnetic field, at the same time and by using the same sensor. In fact, and referring now to FIG. 7, the multiferroic capacitor 22 can be divided into a bias portion 72 and a sensing portion 74, which can be deposed onto substrate 76. Sensing portion 74 can include a charge collector for sensing electric field, such as Lead zirconium titanate, or PZT, as well as a magnetostrictive layer such as an alloy of the formula $Tb_xDy_{1-x}Fe_2$ (x~0.3), more commonly referred to as Terfenol-D, The addition of a charge collector can increase the sensitivity of the device to external electric fields, and can allow sensing of a target external electric field that will appear as an AC ripple over the output voltage of the ST circuit, while the magnetic field will be measured through the estimation of the peak value. In order to perform both the measures, possibly simultaneously, multiferroic devices have to be realized with the above-mentioned suitable layout, in which the top electrode is divided into a bias part and a sensing part. FIG. 7 illustrates an example of such a layout.

With the above layout, the same device can be used to measure electric fields. If present, an AC electric field can modulate the output of the sensor, yielding a slow modulating wave, which can be superimposed on the magnetic field induced oscillations, and whose characteristics can depend on the external electric field (or on the external electric polarization). Measures of the magnetic field and of the electric field can be performed simultaneously, because the amplitude and the frequency of the carrier wave depend on the magnetic field, while the (modulating) wave ripple and its frequency depend on the electric field.

Figure 8:
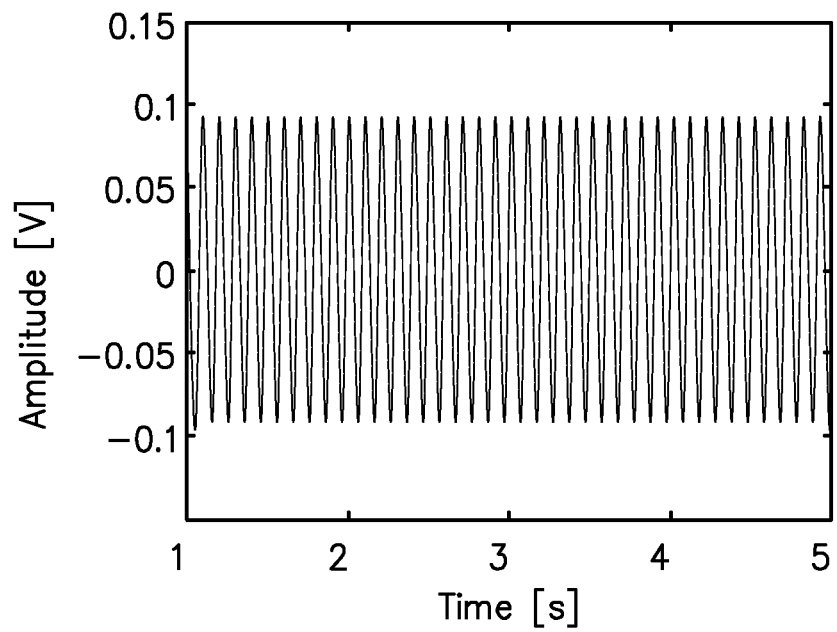
FIG. 8 is a graph of the voltage response output signal of the ST circuit of the sensor of FIG. 2 in absence of an external electric field.
Figure 9:
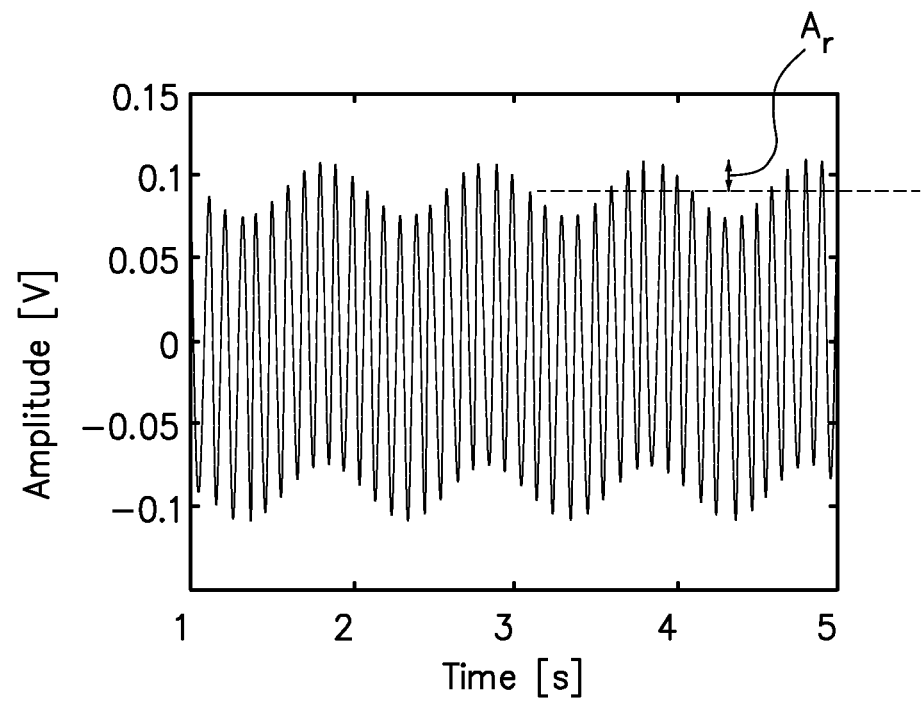
FIG. 9 is the same graph as FIG. 8, but in the presence of an electric field.

FIGS. 8 and 9 can illustrate these phenomena. FIG. 8 depicts a representative output signal of the ST circuit 20 in absence of an external electric field, while FIG. 9 depicts the output signal of ST circuit 20 in presence of an electric field. Simulations were performed for an external magnetic field of 0.01 T, imposing an external sinusoidal polarization of 5 mC/cm² amplitude and a frequency of 1 Hz. Simulations were performed to verify that the sensor output changes with an imposed target electric field. The Results are reported in Table 3, which can list value of the ripple amplitude ($A_r$ in FIG. 9) as a function of applied electrical polarization signal for a single (N=1) ST circuit 20.

TABLE 3

| Electric Polarization (mC/cm²) | Ripple Amplitude (mV) |
|---|---|
| 5 | 29 |
| 10 | 55 |
| 15 | 77 |

Figure 10:
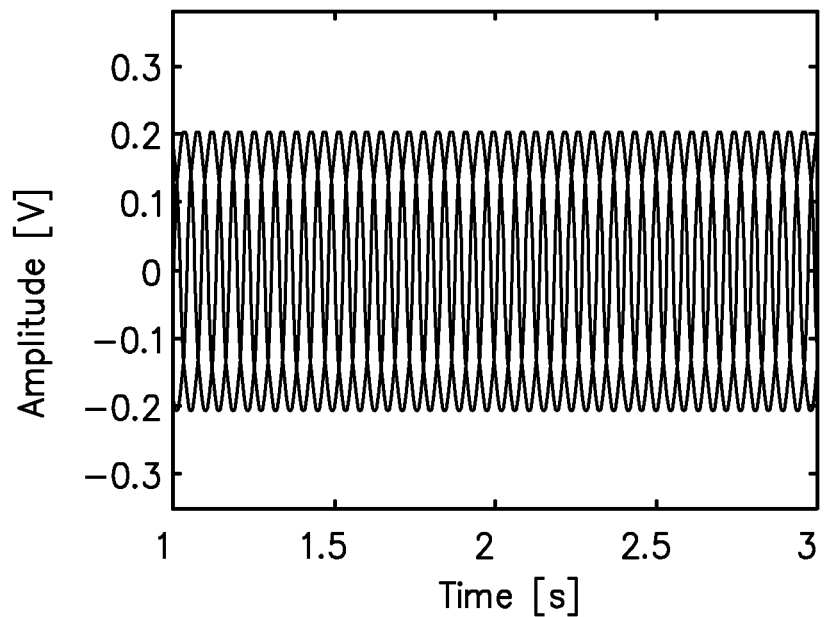
FIG. 10 is a graph of voltage response the ring configuration of FIG. 4 in the absence of an external electric field.
Figure 11:
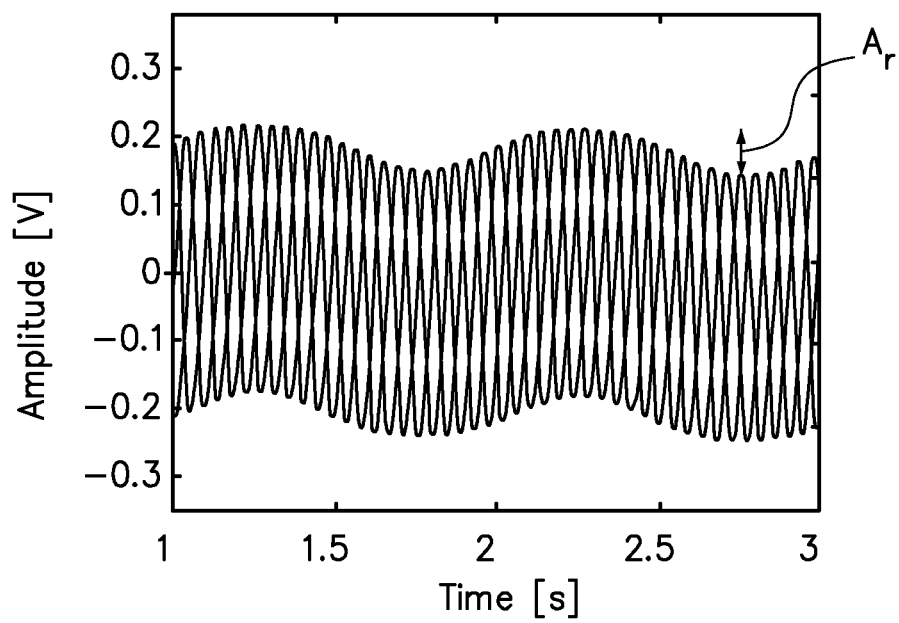
FIG. 11 is the same graph as FIG. 10, but in the presence of an electric field; and, FIG. 12 is a block diagram of steps that can be taken to practice the methods of the present invention according to several embodiments.

Next, the behavior of ring 40 configuration of ST circuits 20 in the presence of an external electric field was simulated. Simulations were performed with Simulink software. The results are reported in FIGS. 10 and 11. FIG. 10 illustrates the output signal of the coupled ring 40 in absence of an external electric field, while FIG. 11 illustrate the output signal of ring 40 in presence of an electric field. Simulations were performed for an external magnetic field of 0.01 T, imposing an external sinusoidal polarization of 5 mC/cm² amplitude and a frequency of 1 Hz.

From FIGS. 10 and 11, it can again be observed that the external electric field can modulate the outputs of the multiferroic devices adding a ripple, whose amplitude and frequency depend on the amplitude and frequency of the target electric field. Table 4 reports the results obtained by imposing three different electric polarization values. As shown in Table 4, the ripple amplitude $A_r$ can increase with the external electric field value.

TABLE 4

| Electric Polarization (mC/cm²) | Ripple Amplitude (mV) |
|---|---|
| 5 | 22 |
| 10 | 42 |
| 15 | 60 |

Analogous to the case of a magnetic field sensor, when the target field is an electric polarization the sensitivity can be evaluated considering the following equation:

$$S_P^{Ar}=100((\Delta A_r/A_{rmax})/(\Delta P/P_{max})) \quad (7)$$

Where $A_r$ is the ripple amplitude and P is the external polarization. Noting that the amplitude of the oscillations is larger in the coupled system than in the single system, we find a sensitivity of 95% in this case compared to 93% for the single circuit case Thus, the responsivity can be slightly larger in the coupled case.

Figure 12:
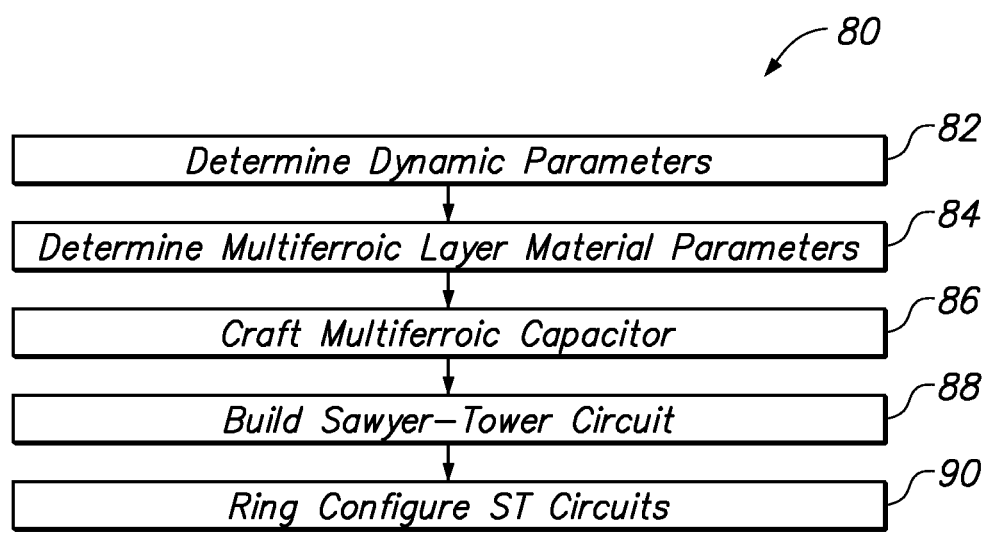

Referring now to FIG. 12, a block diagram that explains steps that can be taken to practice the methods according to several embodiments is shown and generally designated by reference character 80. As shown method 80 can include the initial step 82 of determining the dynamical parameters for the ferroelectrical component multiferroic capacitor. Landau-Khalatnikov theory can be used to accomplish this step. Next, the methods can include the step of obtaining in material parameters of the multiferroic layer, as shown by step 84. Once the parameters have been obtained, the methods can include the step of crafting the multiferroic capacitor for ST circuit 20, as shown by block 86. This step can be accomplished by epitaxially growing BDFO or similar type material on a $SrTiO_3$ substrate. The BDFO surface area $A_{MF}$ for multiferroic capacitor 22 can be chosen according to the parameters of step 84. The methods can further include the steps of incorporating the multiferroic capacitor 22 into an ST circuit 20 (steps 88) and coupling an odd number of crafted ST circuits 20 in a ring 40 configuration, as shown by step 90. The odd number of crafted ST circuit can be chosen according to the level in impurities in the multiferroic layer of multiferroic capacitor 22 and the desired size and sensitivity of the device.

The use of the terms "a" and "an" and "the" and similar references in the context of describing the invention (especially in the context of the following claims) is to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A sensor for detecting both magnetic fields and electric fields, comprising:
    at least one Sawyer-Tower (ST) circuit-incorporating a multiferroic capacitor;
    wherein said at least one ST circuit comprises an odd number of ST circuits coupled together in a ring configuration so that for each ST circuit, the output of one of said odd number of ST circuits is an input to another of said odd number of ST circuits; and,
    wherein said ring configuration allows detection of both said magnetic fields and said electric fields with the same said sensor, without an input driving current.

2. The sensor of claim 1, wherein each of said multiferroic capacitors further comprises a multiferroic layer placed on a substrate, and wherein said multiferroic layer has an amount of impurities, and wherein the number of said odd number of ST circuits to be coupled together is chosen according to said amount of impurities.

3. The sensor of claim 1, wherein said multiferroic material is BDFO.

4. The sensor of claim 1, wherein said multiferroic capacitor further comprises a bias part and a sensing part, said sensing part including a charge collector for sensing said electric fields.

5. A method for detecting both magnetic fields and electric fields with the same sensor and with an input driving current into the sensor, comprising the steps of:
    A) establishing at least one Sawyer-Tower (ST) circuit; and
    B) incorporating a multiferroic capacitor into said at least one ST circuit;
    C) coupling an odd number of ST circuits from said step A) in a ring configuration so that for each of said odd number of ST circuits, the output of one of said odd number of ST circuits is an input to another of said at odd number of ST circuits; and,
    D) using said ring configuration from said step C) to detect both said magnetic field and said electric field with the same said sensor, and without said input driving current to said sensor.

6. The method of claim 5, wherein said step B) further comprises the steps of:
    B1) affording a substrate
    B2) deposing multiferroic material onto said substrate.

7. The method of claim 6, wherein the accomplishment of step B2) causes impurities in said multiferroic layer, and further where said step C) is accomplished so that the number of said odd number of ST circuits is chosen according to the level of impurities in said multiferroic layer.

8. The method of claim 6, wherein said multiferroic material is BDFO.

* * * * *